United States Patent
Moriyama et al.

(10) Patent No.: US 6,908,694 B2
(45) Date of Patent: Jun. 21, 2005

(54) ORGANIC ELECTROLUMINESCENCE DEVICE

(75) Inventors: Takashi Moriyama, Kawasaki (JP); Shinjiro Okada, Isehara (JP); Akira Tsuboyama, Sagamihara (JP); Takao Takiguchi, Tokyo (JP); Koji Noguchi, Sagamihara (JP); Jun Kamatani, Kawasaki (JP); Manabu Furugori, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 09/996,883

(22) Filed: Nov. 30, 2001

(65) Prior Publication Data

US 2002/0068192 A1 Jun. 6, 2002

(30) Foreign Application Priority Data

Dec. 1, 2000 (JP) ........................................ 2000-366549

(51) Int. Cl.$^7$ ............................................. H05B 33/00
(52) U.S. Cl. ..................... 428/690; 428/917; 257/88; 257/99; 257/100; 313/504; 313/512
(58) Field of Search ................... 313/505, 512, 313/504, 503, 506; 257/88, 99, 100; 428/690, 917

(56) References Cited

U.S. PATENT DOCUMENTS

| | | | | |
|---|---|---|---|---|
| 5,229,628 A | * | 7/1993 | Kobayashi et al. | 257/103 |
| 5,427,858 A | * | 6/1995 | Nakamura et al. | 428/421 |
| 6,097,147 A | * | 8/2000 | Baldo et al. | 313/506 |
| 6,528,942 B1 | * | 3/2003 | Tada et al. | 313/506 |
| 6,611,098 B2 | * | 8/2003 | Mori et al. | 313/512 |

FOREIGN PATENT DOCUMENTS

| | | |
|---|---|---|
| JP | 7-169567 | 7/1995 |
| JP | 07-169567 | * 7/1995 |

OTHER PUBLICATIONS

C.W. Tang, et al., *Organic Electroluminescent Diodes*, Appl. Phys. Lett. 51 (12), Sep. 1987, pp. 913–915.

M.A. Baldo, et al., "Very High–Efficiency Green Organic Light–Emitting Devices Based On Electrophosphorescence", Appl. Phys. Lett., vol. 75, No. 1, Jul. 1999, pp. 4–6. Preprint for 54$^{th}$ Meeting of the Applied Physics of Japan, 1127 (1993).

"Organic EL Devices Doped with a Quinacridone Derivative Showing Higher Brightness and Luminescent Efficiency", English text, Preprint For 54$^{th}$ Meeting Of The Applied Physics Of Japan, 1127(1993).

* cited by examiner

*Primary Examiner*—Rena Dye
*Assistant Examiner*—Camie Thompson
(74) *Attorney, Agent, or Firm*—Fitzpatrick, Cella, Harper & Scinto (57) ABSTRACT

A luminescence device is constituted by a substrate, a first electrode disposed on the substrate, at least one organic luminescence function layer disposed on the first electrode, a second electrode disposed on the above at least one organic luminescence function layer, and an oxygen absorbent disposed between the substrate and the second electrode or between the first and second electrodes. To the luminescence device, a voltage is applied between the first and second electrodes to cause phosphorescence from at last one layer constituting the above-mentioned at least one organic luminescence function layer preferably containing the oxygen absorbent. The oxygen absorbent may be formed in a layer disposed at a region other than pixel portions.

5 Claims, 3 Drawing Sheets

ORGANIC ELECTROLUMINESCENCE DEVICE

FIELD OF THE INVENTION AND RELATED ART

The present invention relates to an organic electroluminescence (EL) device used as a light-emitting device for flat panel displays, projection displays, printers, etc.

Self-emission type devices for the flat panel display, such as a plasma emission device, a field emission device, and an electroluminescence (EL) device have attracted notice in recent years.

Of these self-emission type devices, the EL device is classified into an organic EL device and an inorganic EL device.

The inorganic EL device is a self-emission device utilizing luminescence based on collisional excitation. On the other hand he organic EL device is a self-emissin device of a carrier injection-type utilizing luminescence caused at the time of recombination of electron and hole carried into a luminescence layer.

With respect to the organic EL device, T. W. Tang et al. have substantiated in 1987 that it is possible to realize a high-luminance luminance (1000 cd/m$^2$) at a lower voltage (10 volts) by utilizing a lamination structure comprising a film of fluorescent metal chelate complex and a film of diamine-based molecules.

The self-emission device of carrier injection-type has extensively studied and developed. Specifically, organic EL devices using low-molecular weight materials for green luminescence or area color-type luminescence of, e.g., red (R), green (G) and blue (B) have been commercialized. Further, at present, a full-color organic EL device has been extensively developed.

Figure 1:
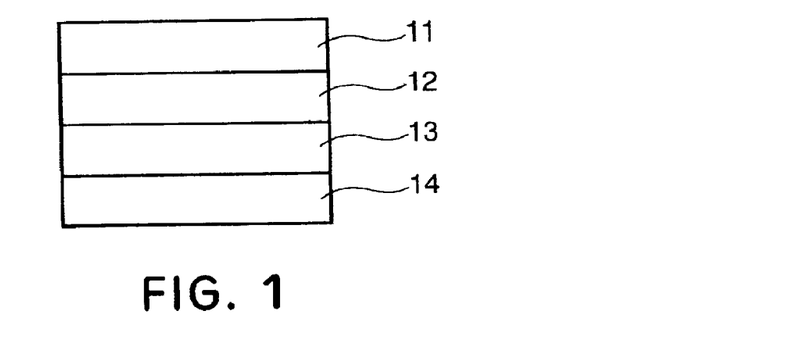
FIGS. 1 and 2 are respectively a schematic sectional view of an ordinary organic electroluminescence device.
Figure 2:
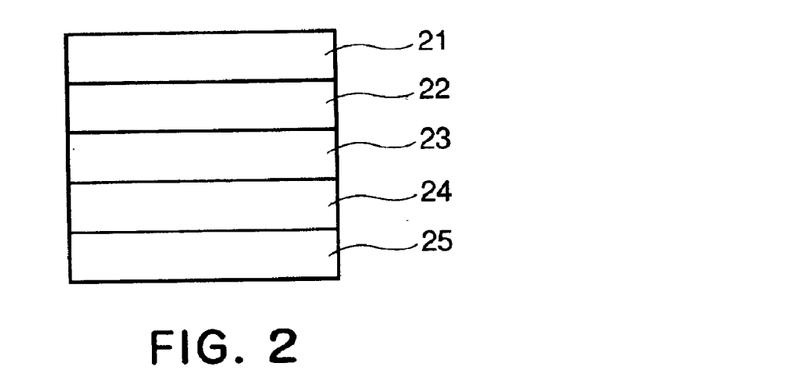

FIGS. 1 and 2 are respectively a schematic sectional view of an embodiment of an ordinary organic EL device of lamination organic luminescence function layer-type. Referring to FIGS. 1 and 2, the organic EL device comprises a cathode 11 or 21, an anode 14 or 25, and a lamination organic luminescence function layer, including a luminescence layer 12 or 23 and a hole transport layer 13 or 24, disposed between the cathode 11 or 21 and the anode 14 or 25. In FIG. 2, an electron transport layer 22 is disposed between the cathode 21 and the luminescence layer 23.

Examples of a material for the cathode 11 or 21 may generally include metals having smaller work functions, such as aluminum, aluminum-lithium alloy and magnesium-silver alloy. Further, as a material for the anode 14 or 25 as a transparent electrode, it is possible to use an electroconductive material having a lager work function, such as ITO (indium tin oxide), thus allowing light emission via the transparent electrode.

The organic luminescence function layers disposed between the cathode 11 or 21 and the anode 14 or 25 may have a two-layer structure including the luminescence layer 12 and the hole transport layer 13 as shown in FIG. 1 and a three-layer structure including the electron transport layer 22, the luminescence layer 23, and the hole transport layer 24 as shown in FIG. 2.

The hole transport layer 13 or 24 has a function of efficiently injecting holes from the anode 14 or 25 to the luminescence layer 12 or 23. The electron transport layer 22 has a function of efficiently injecting electrons from the cathode 21 to the luminescence layer 23. Further, the hole transport layer 13 or 24 and the electron transport layer 22 also have functions of confining electrons and holes in the luminescence layer 12 or 23, respectively (i.e., carrier blocking functions), thus enhancing a luminescence efficiency.

A commercially available liquid crystal display device as a full-color flat panel-type display device effects full-color image display by using, e.g., color filters.

On the other hand, the organic EL device allows self-emission of primary colors of red (R), green (G) and blue (B) by appropriately selecting materials constituting luminescence layers, thus advantageously provide a resultant EL device with a high responsiveness and a wide viewing angle.

In order to realize a sufficiently practical full-color display device, it is necessary to provide a luminescence device excellent in luminance, chromaticity, and luminescence efficiency for respective colors (R, G, B).

Generally, it is difficult to satisfy the above luminescence characteristics in combination in the case of forming luminescence layers for R, G, B of a single material. In order to obviate the difficulty, an organic EL device of a colorant doping-type wherein a host material is doped with a fluorescent organic compound (fluorescent colorant) to shift its emission center wavelength is generally employed. More specifically, referring again to FIGS. 1 and 2 at least one material for constituting organic luminescence function layers (the hole transport layer, the electron transport layer, the luminescence layer, etc.) is used as a host and is doped with a small amount of the fluorescent colorant to utilize luminescence from the fluorescent colorant. In this case, it is possible to use a colorant exhibiting a higher fluorescence efficiency, thus allowing improvement in quantum efficiency and a wide latitude in selection of respective luminescence colors.

With respect to such a fluorescent colorant-doped organic EL device, Murayama et al. has proposed a luminescence device using an aluminum quinolinol complex doped with a quinacridone derivative, whereby a maximum luminance of at least 100,000 cd/m$^2$ has been achieved (Preprint for 54th Meeting of the Applied Physics of Japan, 1127 (1993).

In the organic EL device, as described above, holes and electrons carried into a luminescence layer are recombined to form an excitation state, thus causing luminescence.

Accordingly, in the organic EL device, excitation energy is required to suppress consumption thereof in steps other than a luminescence step in order to efficiently utilize the excitation energy as that for luminescence in a step of transition of organic material molecules contributing to luminescence from an excitation state to a ground state.

There are several factors for such energy consumption, whereby device characteristics are adversely affected considerably. For example, a luminescence efficiency is lowered to result in a dark luminescence state or luminescence per se is not caused to occur.

Generally, the organic EL device is considerably affected by moisture (or water content). Specifically, the organic EL device is accompanied with a defective region causing no luminescence therein (called "dark spots") due to degradation or deterioration of a metal electrode and/or adsorption of water content to impurities in some cases. Such dark spots are gradually enlarged with time by the influence of water content, thus adversely affecting the life of the organic EL device.

Further, in addition to the influence of water content, it has been generally known that oxygen entering the organic EL device oxidizes electrodes and/or organic materials used therein, thus lowering durability of the organic EL device.

In order to overcome the problem, Japanese Laid-Open Patent Application (JP-A) 7-169567 has disclosed such a device structure that a sealing structure including an oxygen absorbent layer for oxygen absorption and an oxygen barrier layer with little oxygen permeability is formed outside an organic EL device structure.

In the organic EL device of this type, however, a fluorescence organic compound is used as a luminescence center material as in the above-described conventional EL devices, thus merely providing a lower quantum efficiency and a lower luminance relative to power supply.

This may be attributable to the following mechanism.

Carriers, such as electrons and holes, injected from a pair of oppositely disposed electrodes are recombined within a luminescence layer formed of a organic luminescence function material to place molecules of the organic luminescence function material in an excited state (higher energy state) (herein, such molecules are referred to as "excitons"). The excited state includes an excited single state and an excited triplet state determined based on a difference in spin state. In the case of an ordinary fluorescent organic compound, only fluorescence from the excited singlet state is observed at room temperature and no phosphorescence from the excited triplet state is observed.

In this case, according to the statistical method, excitons placed in the single state and those placed in the triplet state may presumably be formed in a ratio of 1:3. For this reason, a theoretical limit of an internal quantum efficiency in the case of an organic EL device using a fluorescent material has been considered to be 25%. Further, in the case of an organic EL device of a simple lamination-type, an efficiency for taking emitted light out is ca. 20%, thus resulting in an external quantum efficiency of ca. 5% as an upper limit value. Indeed, the conventional organic EL devices at best provide an external quantum efficiency of ca. 5%.

In order to improve the external quantum efficiency of the organic EL device, Baldo et al. has proposed an organic EL device exhibiting an external quantum efficiency increased up to ca. 8% by using a metal complex containing iridium as a center metal and a phenylpyrimidine ligand ("Applied Physics Letters", Vol. 75, No. 1, pp. 4- (1999)). The higher external quantum efficiency may be attributable to a particular triplet state of the iridium complex exhibiting a stronger phosphorescence. Based on the stronger phosphorescence, it is possible to efficiently utilize excitons in the triplet state occupying the remaining 75% of all the excitons. As a result, the internal quantum efficiency can be estimated to be increased up to 100% as the theoretical limit.

As described above, in recent years, an organic EL device using a phosphorescent material has attracted notice as a high-efficiency self-emission device.

The organic EL device utilizing phosphorescence is, however, accompanied with a serious problem of oxygen quenching (quenching due to oxygen) causing deterioration in initial performance or that with time of the resultant EL device. According to our study, this problem is particularly noticeable in th case of the organic EL device using a phosphorescent material compared with that using a fluorescent material.

This may be attributable to the following factors (1) and (2).

(1) A ground state of oxygen is a triplet state, thus readily causing energy transfer or transition between the oxygen triplet state and an excited triplet state of molecules of a luminescent material to take the excitation energy of the luminescence material molecules (i.e., oxygen quenching).

(2) The life of an excited triplet state is longer than that of an excited single state by at least three digits. For this reason, a time from the energy excitation step to a subsequent luminescence step is longer in the case of utilizing phosphorescence, thus resulting in an increased probability of consumption of the excitation energy due to energy transition with no luminescence including the oxygen quenching.

As a result of our study, it has been confirmed that the presence of oxygen in an organic EL device particularly using a phosphorescent material adversely affects not only an initial luminescence luminance but also the life of the resultant EL device, such as lowerings in luminescence luminance and luminescence efficiency when the EL device is continuously or discontinuously driven for a certain period of time. It has been also found that such lowerings in luminescence luminance and efficiency are considerably pronounced when compared with the conventional organic EL device using a fluorescent material.

SUMMARY OF THE INVENTION

A principal object of the present invention is to provide an organic electroluminescence device having solved the above-mentioned problems.

A specific object of the present invention is to provide a high-efficiency organic electroluminescence device using a phosphorescent material capable of suppressing the influence of oxygen to improve an initial luminance and present a deterioration in performances with time in combination.

According to the present invention, there is also provided a luminescence device, comprising: a substrate, a first electrode disposed on the substrate, at least one organic luminescence function layer disposed on the first electrode, a second electrode disposed on said at least one organic luminescence function layer, and an oxygen absorbent disposed between the substrate and the second electrode.

According to the present invention, there is also provided a luminescence device, comprising: a substrate, a first electrode disposed on the substrate, at least one organic luminescence function layer disposed on the first electrode, a second electrode disposed on said at least one organic luminescence function layer, and an oxygen absorbent disposed between the first electrode and the second electrode.

In the luminescence device (organic EL device) of the present invention, the above-mentioned oxygen absorbent may preferably be contained in at least one layer constituting the organic luminescence function layer by blending or co-vapor deposition or disposed in proximity to the organic luminescence function layer using a phosphorescent material, thus allowing absorption and/or adsorption of oxygen within the luminescence device to effectively suppress not only a lowering in initial luminescence luminance but also a deterioration in performances (e.g., luminescence efficiency) of the device with time at repetitive use.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 3:
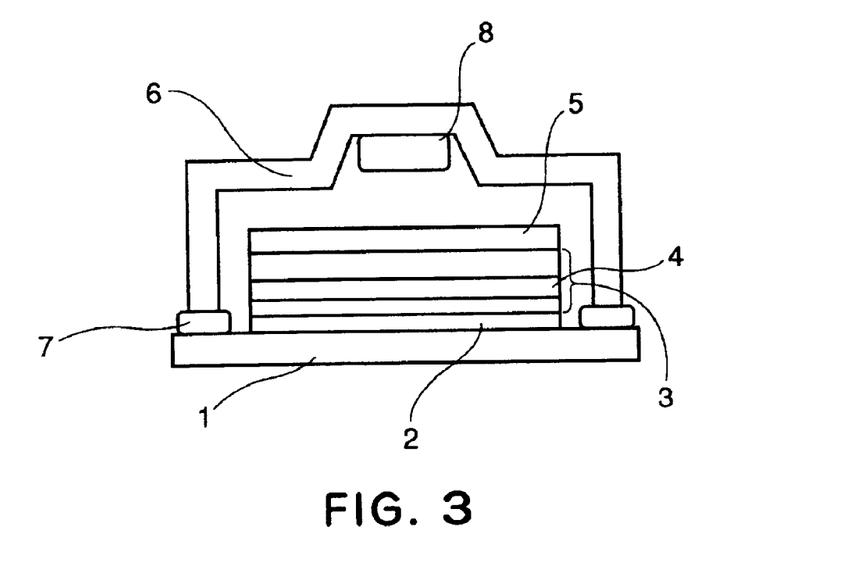
FIG. 3 is a schematic sectional view of an embodiment of the luminescence device organic electroluminescence device according to the present invention.

The organic electroluminescence device according to the present invention basically has a structure shown in FIG. 3.

Referring to FIG. 3, an organic EL device includes: a substrate 1, an anode 2, at least one organic luminescence function layer 2 including an organic luminescence function layer 4 containing an oxygen absorbent, a cathode 5, a sealing housing (or casing) 6, an adhesive resin 7, and a hygroscopic agent 8. The substrate 1, the sealing housing and the adhesive resin together constitute a sealing means.

The substrate 1 may preferably be formed of a transparent heat-resistant material, such as glass.

On the substrate 1, the anode 2 as a transparent electrode is formed. Examples of a material for the anode (transparent electrode) 2 may include those exhibiting a higher work function, such as CuI, ITO (indium tin oxide) and $SnO_2$, so as to improve a hole injection efficiency from the anode.

On the anode 2, at least one organic luminescence function layer 3 at least containing a luminescent material. The organic luminescence function layer 3 may have a single-layer structure or a lamination-layer structure which includes two layers comprising a luminescence layer and an electron transport layer or a hole transport layer; three layers comprising a luminescence layer, an electron transport layer and a hole transport layer; and four or more layers including the above layers. The organic luminescence function layer 3 may be formed by vacuum deposition or spin coating.

The luminescence layer contained in the organic luminescence function layer 3 comprises a phosphorescent material, such as a metal complex containing a heavy metal (as a center metal) having a large spin-orbit interaction (e.g., Ru, Rh, Pd, Os, Ir Pt, Au, etc.). Representative examples of the phosphorescent material may include iridium complexes having a ligand, such as phenylpyridine o or thienylpyridine; and platinum porphyrin derivatives.

The oxygen absorbent used in the present invention may be contained in a part of the organic luminescence function layer 3 or the entire organic luminescence function layer 3. In FIG. 3, the oxygen absorbent is contained in the organic luminescence function layer 4 constituting the three-layer type organic luminescence function layer 3 as a part of the organic luminescence function layer 3.

Examples of a material for the oxygen absorbent may include metals having a lower work function such as alkali metal and alkali earth metal; and compounds including metal oxides, such as iron oxide.

Herein, the oxygen absorbent refers to a substance capable of selectively absorbing and/or adsorbing oxygen physically or chemically.

The organic luminescence function layer containing the oxygen absorbent may be formed by co-vacuum deposition of the oxygen absorbent with the organic luminescence function material (such as a luminescent material) or by spin-coating a solution of an oxygen absorbent powder in an appropriate solvent (such as chloroform).

On the organic luminescence function layer 3, the cathode 5 as a metal electrode is formed, thus preparing an organic EL device having a principal structure.

Examples of a material for the cathode 5 may preferably include those having a lower work function, such as Mg—Ag ally, Al, and Al—Li alloy, so as to improve an electron injection efficiency from the cathode.

In order to hermetically seal up the above-prepared organic EL device so as to block ambient air, the housing 6 is bonded to the substrate 1 at a periphery thereof so as to enclose the organic EL device by using the adhesion resin 7.

Examples of a material for the housing 6 may preferably include a moisture barrier material, such as glass or metal. Examples of a material for the adhesive resin 7 may preferably include epoxy resin and UV (ultraviolet)-curable resin.

At the inner surface of the sealing housing 6, the hygroscopic agent 8 may preferably be disposed in order to suppress the influence of moisture (water content). Examples of a material for the hygroscopic agent 8 may preferably include oxides, such as calcium oxide and barium oxide.

With a spacing between the sealing housing 6 and the organic EL device of the present invention, inert gas such as rare gas (e.g., argon gas) or nitrogen gas may preferably be filled in order to remove gases adversely affecting the organic EL device including oxygen.

In the present invention, the oxygen absorbent may be disposed not only within the organic EL device but also within the sealing housing at the same time.

Figure 4:
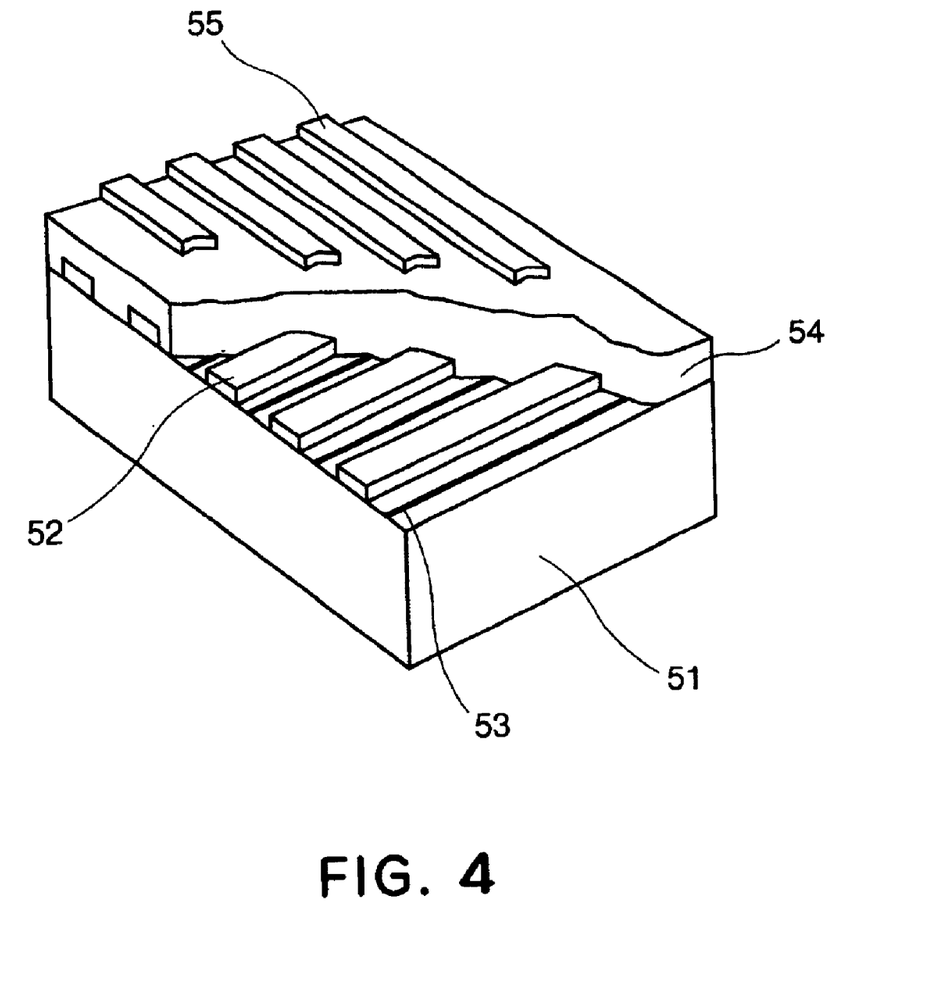
FIG. 4 is a schematic sectional view of an embodiment of the luminescence device of a simple matrix-type according to of the present invention.

FIG. 4 shows another embodiment of the luminescence device (organic EL device) according to the present invention.

Referring to FIG. 4, in this embodiment, the organic EL device includes an oxygen absorbent 53 formed on a substrate 51 in a stripe shape at a spacing between stripe-shaped first electrodes 52. On the first electrode 52, an organic luminescence function layer 54 containing a luminescence layer is disposed. On the organic luminescence function layer 54, stripe-shaped second electrodes 55 ar disposed so as to intersect the first electrodes 52 to form a matrix of pixels each at an intersection.

Hereinbelow, the present invention will be described more specifically based on Examples.

EXAMPLE 1

On a 1.1 mm-thick glass substrate (20×25 mm), a ca. 100 nm-thick transparent electrode (anode) of ITO (indium tin oxide) was formed by sputtering, followed by patterning.

On the ITO electrode, four organic luminescence function layers (first to fourth layers) were successively formed in the following manner.

First, on the ITO electrode, a 40 nm-thick first layer (hole transport layer) of α-NPD (N4,N4'-di-naphthalene-1-yl-N4, N4'-diphenylbiphenyl-4,4'-diamine) shown below was formed by vacuum deposition ($2.7×10^{-3}$ Pa).

On the first layer, a 40 nm-thick second layer (luminescence layer) of a luminescent material comprising CPB (4,4'-N,N'-dicarbazole biphenyl) shown below and Ir(ppy)$_3$ (fac tris(2-phenylpyridine)iridium) (CBP:Ir(ppy)$_3$=93:7 by weight) by co-vacuum deposition (2.7× 10$^{-3}$ Pa) at a controlled deposition rate.

CBP

Ir(ppy)$_3$

On the second layer, a 10 nm-thick third layer (exciton diffusion prevention layer) of BCP (2,9-dimethyl-4,7-diphenyl-1-10-phenanthroline (Bathocuproin)) shown below doped with 1 wt. % of Mg (magnesium) by co-vacuum deposition (2.7×10$^{-3}$ Pa) at a controlled deposition rate.

On the third layer, a 20 nm-thick fourth layer (electron injection layer) of Alq3 (tris(8-hydroxyquinoline)aluminum (aluminum-quinolinol complex)) shown below doped with 1 wt. % of Mg by co-vacuum deposition (2.7×10$^{-3}$ Pa) at a controlled deposition rate.

In this example, as an oxygen absorbent, Mg was used in the third and fourth layers in a form of co-deposited film.

On the thus-formed four organic luminescence function layers, a 150 nm-thick Al electrode (cathode) was formed by vacuum deposition (2.7×10$^{-3}$ Pa) with a hard mask of stainless steel so as to provide a matrix of pixels each having an area of 3 mm$^2$ at each intersection with the patterned ITO electrode, thus preparing an organic EL device according to the present invention.

The thus-prepared organic EL device was placed in a glove box filled with nitrogen gas, and a sealing housing of glass was bonded thereto by using an epoxy resin adhesive. At that time, CaO powder (hygroscopic agent) was sealed in a spacing between the EL device and the sealing housing.

Characteristics of the EL deice were measured at room temperature by using a microammeter ("Model 4140B", mfd. by Hewlett-Packard Co.) for a current-voltage characteristic and a luminance meter ("Model BM 7", mfd. by Topcon K. K.) for a (luminescence) luminance. As a result, the EL device of the present invention showed a good rectification characteristic.

More specifically, when the organic EL device was driven by applying a voltage of 12 volts between the ITO electrode (anode) and the Al electrode (cathode), the EL device showed a current density of 9 mA/cm$^2$ and a luminance of 1900 cd/m$^2$. At that time, a higher external quantum efficiency of 5.7% was obtained.

Then, when a change in luminance from an initial luminance of 100 cd/m$^2$ of the EL device was measured by continuously driving the EL device at a constant current, the EL device exhibited a luminance half-life (a time for decreasing the initial luminance ((100 cd/m$^2$) to ½ thereof (50 cd/m$^2$)) of 498 hours.

COMPARATIVE EXAMPLE 1

An organic EL device was prepared and evaluated in the same manner as in Example 1 except that PCB (for the third layer) and Alq 3 (for the fourth layer) were not doped with Mg (i.e., the oxygen absorbent was not used at all).

The resultant organic EL device exhibited a current density of 8.4 mA/cm$^2$ (under application of a voltage of 12 volts), a luminance of 1200 cd/m$^2$, an external quantum efficiency of 3.9%, and a luminance half-lie of 272 hours, thus providing EL characteristics inferior to those of the EL device prepared in Example 1.

EXAMPLE 2

A simple matrix-type organic EL device as shown in FIG. 4 was prepared in the following manner.

On a 1.1 mm-thick glass substrate 51 (75×75 mm), a ca. 100 nm-thick transparent electrode 52 of ITO (anode) was formed by sputtering, followed by patterning in a stripe form including 100 lines each having a width of 100 $\mu$m and a spacing (with an adjacent line) of 40 $\mu$m.

On the stripe ITO electrode 52, an oxygen absorbent of Mg was formed by vacuum deposition with a mask in a stripe pattern 53 at respective center portions of the spacing of the stripe ITO electrode 52 so as to have a width of 10 $\mu$m and a thickness of 50 nm (for each stripe Mg layer).

On the ITO electrode 52 and the stripe pattern 53 of Mg, four organic luminescence function layers 54 were formed in the same manner as in Example 1 except that Mg (as the oxygen absorbent) was not used at all.

Then, on the organic luminescence function layers 54, a lamination metal electrode (cathode) 55 comprising a 10 nm-thick Al—Li alloy layer (Li: 1.3 wt. %) and a 150 nm-thick Al layer (disposed on the Al—Li alloy layer) was formed by vacuum deposition (2.7×10$^3$ Pa), followed by patterning in a stripe form including 100 lines (each having a width of 100 $\mu$m and a spacing of 40 $\mu$m) arranged so as to intersect the stripe ITO electrode 52 at right angles, thus preparing an organic EL device including a matrix of pixels (100×100 pixels) each at an intersection of the lines of ITO and metal electrodes.

The thus-prepared EL device was placed in a glove box filled with nitrogen gas, and a sealing housing of glass (having an area sufficient to enclose the entire EL device) was bonded to the EL device by using an epoxy resin adhesive. At that time, CaO powder (hygroscopic agent) was sealed in a spacing between the EL device and the sealing housing.

Figure 5:
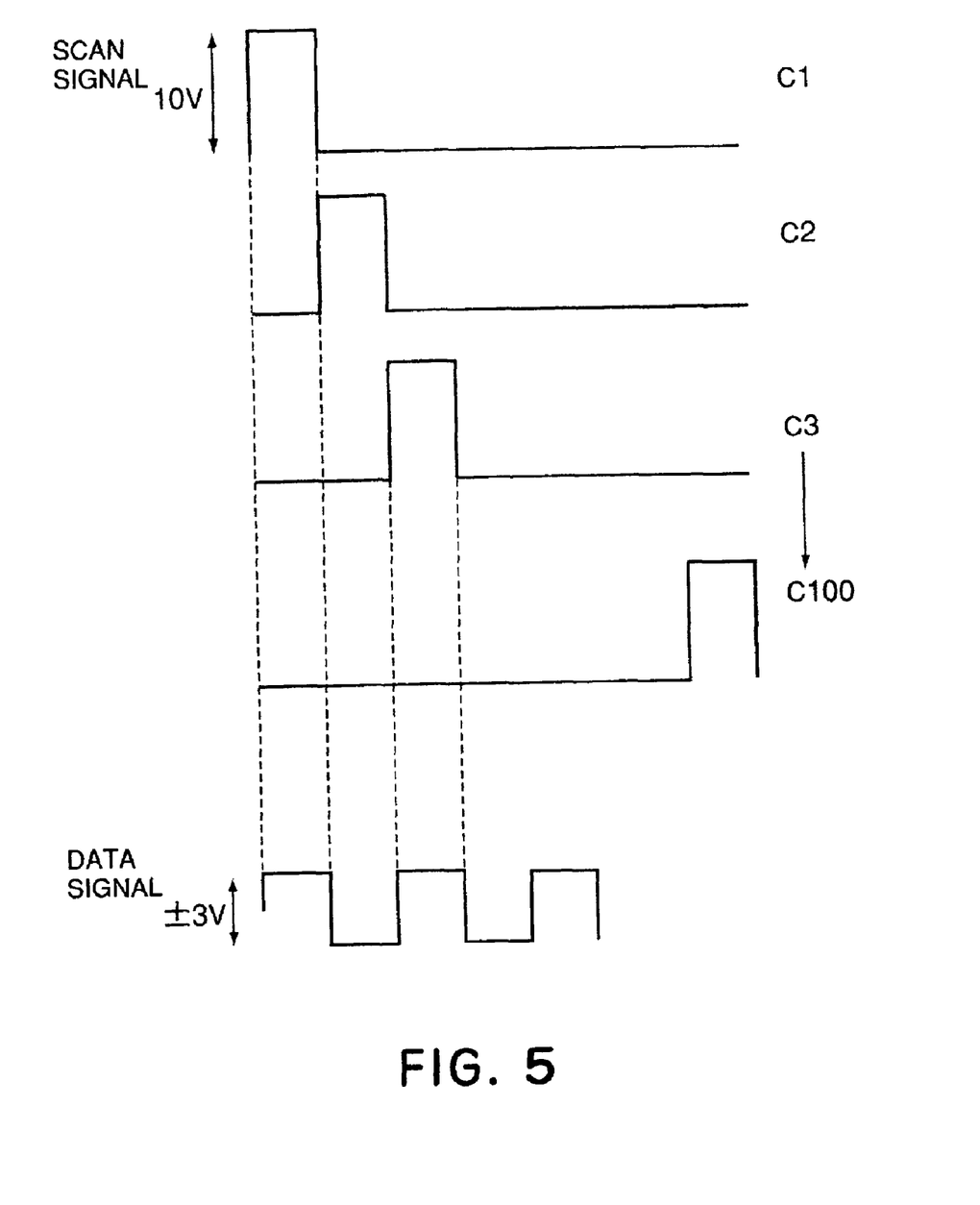
FIG. 5 is a time chart of a drive waveform for driving the luminescence device employed in Example 2 appearing hereinafter.

The EL device (100×100 pixels) was then driven in a simple matrix manner (frame frequency: 30 Hz, interlace scanning manner) in the glove box by applying a drive waveform of 7–13 volts (scanning signal voltage: 10 volts, data signal voltage: ±3 volts) as shown in FIG. 5.

As a result, it was confirmed that the EL device provided smooth motion picture images.

When the EL device (including 100×100 lines) was driven in a line-sequential manner, the EL device showed an initial luminance of 34 cd/m$^2$ in a whole area-luminance state. Further, when the EL device was continuously driven, a resultant luminance half-life was 460 hours.

COMPARATIVE EXAMPLE 2

A simple matrix-type organic EL device was prepared and evaluated in the same manner as in Example 2 except that the stripe Mg layer 53 was not formed (i.e., the oxygen absorbent was not used at all).

The thus-prepared EL device exhibited an initial luminance of 19 cd/m$^2$ and a luminance half-life of 202 hours, thus being considerably inferior in EL characteristics to those of the EL device prepared in Example 2.

As described hereinabove, according to the present invention, it is possible to provide a high-efficiency organic EL device (luminescence device) expected to be further improved in luminescence efficiency with an increased initial luminance and a suppressed deterioration in performance with time while preventing the adverse influence of oxygen.

The organic EL device according to the present invention may be applicable to display apparatus, illumination apparatus, a light source for a printer, a backlight of a liquid crystal display apparatus, etc.

When the EL device was used in combination with a simple-matrix electrode structure or active elements (e.g., TFTs (thin film transistors)) to constitute a display apparatus, it becomes possible to provide flat panel display with an energy saving effect, a high visibility and light-weight properties.

When the EL device is used as a light source for a printer, it becomes possible to utilize the EL device as a laser light source for a laser beam printer. In this case, for example, the EL device as the laser light source is arranged in array to effect a desired light-exposure to a photosensitive drum, thus allowing image formation.

By the use of the EL device of the present invention, it is possible to remarkably reduce the size (or volume) of the above-mentioned apparatus.

Further, with respect to the illumination apparatus and the backlight, a good energy saving effect based on the use of a high-efficiency luminescence device according to the present invention can be expected.

What is claimed is:

1. A luminescence device, comprising a substrate, an anode disposed on the substrate, a plurality of organic layers disposed on the anode, which include at least a luminescent layer, an exciton diffusion prevention layer and an electron injection layer, and a cathode disposed on the electron injection layer, wherein the exciton diffusion prevention layer and the electron injection layer include an oxygen absorbent.

2. A device according to claim 1, wherein a voltage is applied between the anode and the cathode to cause phosphorescence from the luminescent layer.

3. A device according to claim 1, wherein the oxygen absorbent is Mg.

4. A device according to claim 1, further comprising a sealing housing disposed on the substrate in order to cover the luminescence device, and a hygroscopic agent which is sealed in a space between the luminescence device and the sealing housing.

5. A device according to claim 1, wherein the hygroscopic agent is CaO powder.

* * * * *

UNITED STATES PATENT AND TRADEMARK OFFICE
CERTIFICATE OF CORRECTION

| | |
|---|---|
| PATENT NO. | : 6,908,694 B2 |
| APPLICATION NO. | : 09/996883 |
| DATED | : June 21, 2005 |
| INVENTOR(S) | : Takashi Moriyama et al. |

It is certified that error appears in the above-identified patent and that said Letters Patent is hereby corrected as shown below:

ON THE TITLE PAGE [56] REFERENCES CITED:

Foreign Patent Documents, "JP 07-169567 * 7/1995" should be deleted.

ON THE TITLE PAGE [57] ABSTRACT:

Line 9, "last" should read --least--.

COLUMN 1:

Line 20, "he" should read --the-- and
"self-emissin" should read --self-emission--;
Line 30, "has" should read --has been--; and
Line 37, "respectively" should be deleted.

COLUMN 2:

Line 6, "effects" should read --affects--;
Line 24, "2 at" should read --2, at--; and
Line 60, "to" should read --or--.

COLUMN 3:

Line 56, "that" should be deleted; and
Line 57, "th" should read --the--.

COLUMN 4:

Line 28, "present" should read --prevent--;
Line 29, "performances" should read --performance--; and
Line 53, "performances" should read --performance--.

COLUMN 5:

Line 27, "material." should read --material is formed; and--
Line 42, "o" should be deleted.

UNITED STATES PATENT AND TRADEMARK OFFICE
CERTIFICATE OF CORRECTION

PATENT NO.        : 6,908,694 B2
APPLICATION NO. : 09/996883
DATED             : June 21, 2005
INVENTOR(S)       : Takashi Moriyama et al.

It is certified that error appears in the above-identified patent and that said Letters Patent is hereby corrected as shown below:

COLUMN 6:

Line 3, "ally," should read --alloy,--;
Line 48, "pixels" should read --pixels,--; and
Line 51, "Examples" should read --examples--.

COLUMN 7:

Line 18, "by" (second occurrence) should read --is formed by--;
Line 48, "by" should read --is formed by--; and
Line 66, "by" should read --is formed by--.

COLUMN 8:

Line 34, "deice" should read --device--;
Line 52, "((100" should read --(100--; and
Line 65, "half-lie" should read --half-life--.

COLUMN 10:

Line 38, "include" should read --includes--.

Signed and Sealed this

Thirteenth Day of February, 2007

JON W. DUDAS
*Director of the United States Patent and Trademark Office*